United States Patent
Kim

(10) Patent No.: US 9,148,951 B2
(45) Date of Patent: Sep. 29, 2015

(54) DISPLAY APPARATUS

(71) Applicant: Samsung Display Co., Ltd., Yongin, Gyeonggi-Do (KR)

(72) Inventor: Yun-Jae Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 112 days.

(21) Appl. No.: 13/960,572

(22) Filed: Aug. 6, 2013

(65) Prior Publication Data

US 2014/0285982 A1    Sep. 25, 2014

(30) Foreign Application Priority Data

Mar. 25, 2013  (KR) .................. 10-2013-0031576

(51) Int. Cl.
| | |
|---|---|
| *H05K 1/18* | (2006.01) |
| *H05K 1/02* | (2006.01) |
| *H05K 3/36* | (2006.01) |
| *H05K 1/14* | (2006.01) |

(52) U.S. Cl.
CPC .............. *H05K 1/028* (2013.01); *H05K 1/0259* (2013.01); *H05K 1/147* (2013.01); *H05K 2201/10128* (2013.01)

(58) Field of Classification Search
CPC .... G02F 2201/50; H05K 1/189; H05K 1/028; H05K 3/368
USPC ......................................... 361/749; 174/254
See application file for complete search history.

(56) References Cited

U.S. PATENT DOCUMENTS

| | | | | |
|---|---|---|---|---|
| 7,384,301 | B2 * | 6/2008 | Liu ................................ | 439/492 |
| 7,580,103 | B2 * | 8/2009 | Kawaguchi ................... | 349/150 |
| 7,593,234 | B2 * | 9/2009 | Okuda .......................... | 361/749 |
| 8,106,307 | B2 * | 1/2012 | Hayakawa et al. ........... | 174/260 |
| 8,472,203 | B2 * | 6/2013 | Dabov et al. .................. | 361/753 |
| 8,476,532 | B2 * | 7/2013 | Kitano et al. ................. | 174/254 |
| 2005/0088830 | A1 * | 4/2005 | Yumoto et al. ................ | 361/749 |
| 2014/0022744 | A1 * | 1/2014 | Joo ................................ | 361/749 |
| 2014/0183473 | A1 * | 7/2014 | Lee et al. ........................ | 257/40 |
| 2014/0185251 | A1 * | 7/2014 | Enomoto et al. .............. | 361/749 |
| 2014/0240933 | A1 * | 8/2014 | Lee et al. ....................... | 361/749 |
| 2014/0307396 | A1 * | 10/2014 | Lee ................................ | 361/749 |

FOREIGN PATENT DOCUMENTS

| | | |
|---|---|---|
| KR | 10-2004-0066647 A | 7/2004 |
| KR | 10-2005-0104636 A | 11/2005 |
| KR | 10-2008-0067845 A | 7/2008 |
| KR | 10-2009-0108345 A | 10/2009 |

* cited by examiner

Primary Examiner — Jeremy C Norris
Assistant Examiner — Nathan Milakovich
(74) Attorney, Agent, or Firm — Knobbe, Martens, Olson & Bear, LLP

(57) ABSTRACT

A display apparatus is disclosed. In one aspect, the display apparatus includes: a panel assembly outputting an image. The apparatus also includes a flexible printed circuit made of a flexible material including a combination portion having at least a portion coupled to the panel assembly, a base portion disposed to face a lower side of the panel assembly, and a connection portion having at least a portion disposed to be bent to connect the combination portion and the base portion. The apparatus further includes an electrical element mounted on a surface facing the combination portion in the connection portion of the flexible printed circuit.

7 Claims, 5 Drawing Sheets

//DISPLAY APPARATUS

CROSS-REFERENCE TO RELATED APPLICATION

This application claims priority to and the benefit of Korean Patent Application No. 10-2013-0031576 filed in the Korean Intellectual Property Office on Mar. 25, 2013, the entire contents of which are incorporated herein by reference.

BACKGROUND (a) Field

The described technology generally relates to a display apparatus.

(b) Description of the Related Technology

A display apparatus including an organic light emitting element (an organic light emitting diode) as a self-emissive element has a wide viewing angle, excellent contrast, excellent luminance, an excellent driving voltage, and a fast response speed characteristic. An organic light emitting diode (OLED) display including the organic light emitting element includes a panel assembly and a main board, and the panel assembly and the main board are connected by a flexible printed circuit. Here, the flexible printed circuit is mounted with an electrical element for driving.

SUMMARY

One inventive aspect is a display apparatus outputting an image.

Another aspect is a display apparatus protecting electrical elements of a flexible printed circuit (FPC) without disposing a metal shield while realizing slimness.

Another aspect is a display apparatus which includes: a panel assembly outputting an image; a flexible printed circuit made of a flexible material including a combination portion having at least a portion coupled to the panel assembly, a base portion disposed to face a lower side of the panel assembly, and a connection portion having at least a portion disposed to be bent to connect the combination portion and the base portion; and an electrical element mounted on a surface facing the combination portion in the connection portion of the flexible printed circuit.

The electrical element may be disposed at a flat surface in the connection portion.

The flexible printed circuit may further include a protection portion formed to be extended from one side surface of the combination portion or the connection portion and to be bent in a direction adjacent to the electrical element.

One surface of the protection portion may be positioned to be toward the electrical element.

The protection portion may be integrally formed with the combination portion or the connection portion.

The protection portion may be made of the same material as the combination portion or the connection portion.

The flexible printed circuit may include a ground terminal formed at a bottom surface facing a portion in which the electrical element is mounted in the connection portion.

The electrical element may be one of a transistor, a diode, or a capacitor.

DETAILED DESCRIPTION

Figure 1:
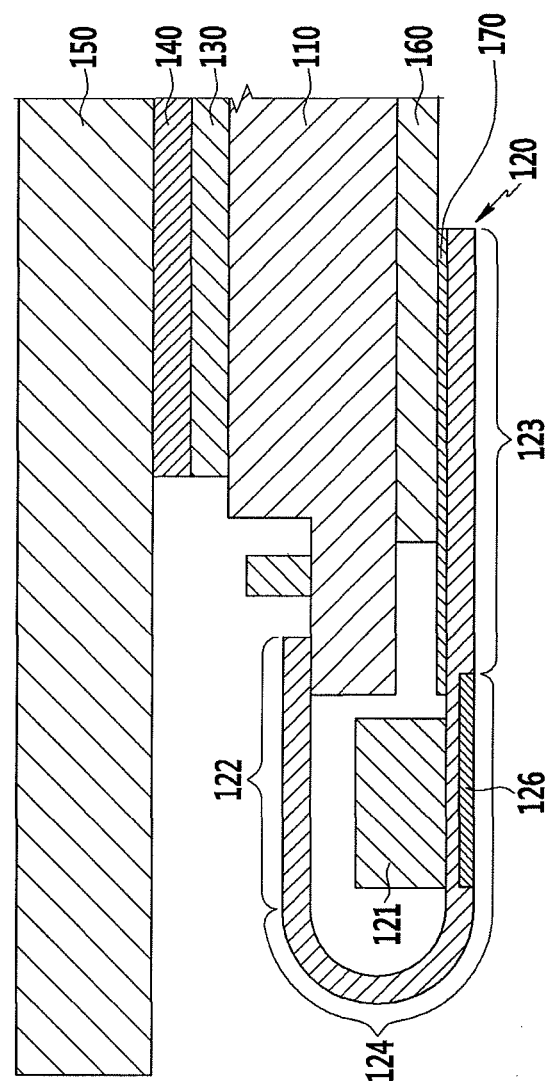
FIG. 1 is a cross-sectional view of a display apparatus according to an exemplary embodiment.

To reduce the thickness of a portable device including the OLED, a hole is formed at an inner frame of the portable device and the electrical element is received in the hole. To protect the electrical element that is weak against high power from an electrical shock such as an electrostatic discharge (ESD), a metal shield (a shield-can) is generally disposed on an outer surface of the electrical element.

However, it is difficult to reduce the thickness of the portable device by the thickness that is occupied by the metal shield. Therefore, there is a problem in realizing slimness of the portable device. Also, a metal shield that is suitable for a portable device of various structures must be manufactured, and various molds to forming these metal shields must be manufactured such that it is difficult to reduce a manufacturing cost. Also, since the hole receiving the electrical element is formed at the frame of the portable device, rigidity of the frame id deteriorated such that it is difficult to improve durability of the portable device.

Embodiments will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Further, in the embodiments, like reference numerals designate like elements throughout the specification representatively in a first embodiment, and only elements of other embodiments other than those of the first embodiment will be described. Like reference numerals designate like elements throughout the specification.

Throughout this specification and the claims that follow, when it is described that an element is "coupled" to another element, the element may be directly coupled to the other element or electrically coupled to the other element through a third element. In addition, unless explicitly described to the contrary, the word "comprise" and variations such as "comprises" or "comprising" will be understood to imply the inclusion of stated elements but not the exclusion of any other elements.

FIG. 1 is a cross-sectional view of a display apparatus according to an exemplary embodiment.

Referring to FIG. 1, a display apparatus 100 includes a panel assembly 110, a flexible printed circuit 120, and an electrical element 121.

An image is output by the panel assembly 110. The panel assembly 110 includes a plurality of organic light emitting elements (not shown). The organic light emitting elements may be patterned to be formed in the panel assembly 110. The panel assembly 110 may include a scan driver (not shown) and a data driver (not shown) for driving pixels. Also, the panel assembly 110 may include pad electrodes (not shown) to transmit electrical signals to the scan driver and the data driver.

The flexible printed circuit 120 is made of a flexible material. An example of the flexible printed circuit 120 may be a flexible copper clad laminate (FCCL) circuit. The flexible printed circuit 120 transmits the electric signals to the panel assembly 110. The flexible printed circuit 120 may be formed by depositing a metal thin film on a film of a plastic material that may be easily flexible.

The flexible printed circuit 120 includes a combination portion 122, a base portion 123, and a connection portion 124. At least a portion of the combination portion 122 is coupled to the panel assembly 110. The combination portion 122 may be coupled to the panel assembly 110 by a chip on film (COF) method, however it is not limited thereto. The base portion 123 is disposed to face a lower side of the panel assembly 110. At least a portion of the connection portion 124 is disposed to be bent to connect the combination portion 122 and the base portion 123. The combination portion 122, the base portion 123, and the connection portion 124 may be integrally formed.

The electrical element 121 may be the last part that becomes a constituent element in the electronic circuit. An example of the electrical element 121 may be one of a transistor, a diode, and a capacitor, however it is not limited thereto. There may be one or more electrical elements 121. This electrical element 121 is mounted on a surface facing the combination portion 122 in the connection portion 124 of the flexible printed circuit. That is, the electrical element 121 may be protected by the flexible printed circuit 120.

In the display apparatus 100 having the above structure, the electrical element 121 is disposed at a space formed by a bent portion of the flexible printed circuit 120. Accordingly, the flexible printed circuit 120 encloses the electrical element 121 to be protected thereby protecting the electrical element 121 from an electrostatic discharge while realizing slimness even though an additional metal shield is not disposed in the electrical element 121. Also, by omitting the additional metal shield, the manufacturing cost may be reduced.

Further, in a conventional display apparatus (not necessarily prior art), the electrical element 121 is formed at the bottom surface of the flexible printed circuit, and a hole receiving the electrical element 121 is formed at a non-illustrated frame. However in the display apparatus 100 according to an exemplary embodiment, the electrical element 121 is not protruded from the bottom surface of the flexible printed circuit 120. Accordingly, resistance of the frame to an external impact is improved by omitting the hole at the non-illustrated frame such that durability of the display apparatus 100 against an external force may be improved.

In some embodiments, the electrical element 121 included in the flexible printed circuit 120 is disposed on the surface that is substantially flat in the connection portion 124. For example, the non-illustrated frame of the display apparatus 100 may be disposed at the lower side of the flexible printed circuit 120. The portion of the connection portion 124 is disposed on the frame thereby being flatly positioned by the frame. The electrical element 121 may be disposed at the portion of the connection portion 124 that is disposed to be flat. By this structure, the state that the electrical element 121 is mounted on the connection portion 124 may be stably maintained.

Figure 2:
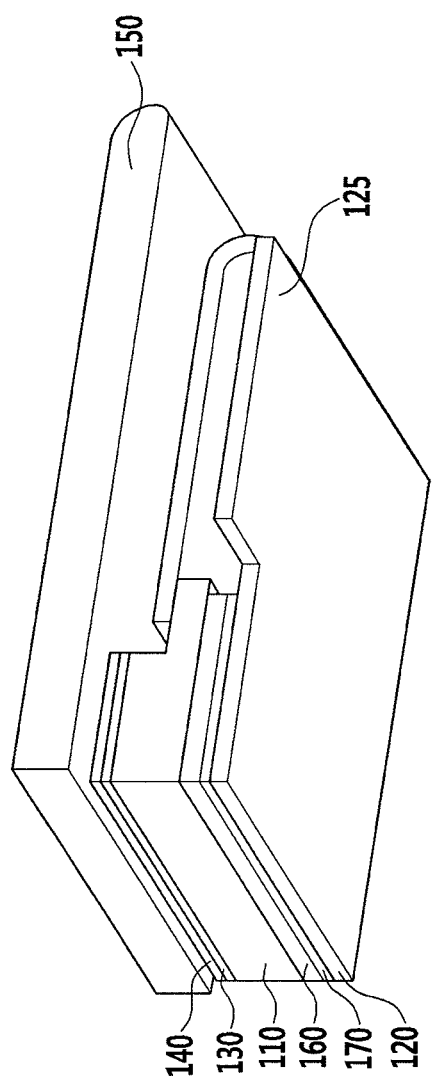
FIG. 2 is a perspective view of a display apparatus according to another exemplary embodiment.

FIG. 2 is a perspective view of a display apparatus according to another exemplary embodiment.

Referring to FIG. 2, the flexible printed circuit 120 may further include a protection portion 125. The protection portion 125 is formed to extend from one side surface of the combination portion 122 or one side surface of the connection portion 124 by a predetermined length and to be bent in a direction close to the electrical element 121. In some embodiments, the protection portion 125 is made of a material having an excellent insulating property. For example, the protection portion 125 may be made of the same material as the combination portion 122 or the connection portion 124 of the flexible printed circuit 120.

Figure 3:
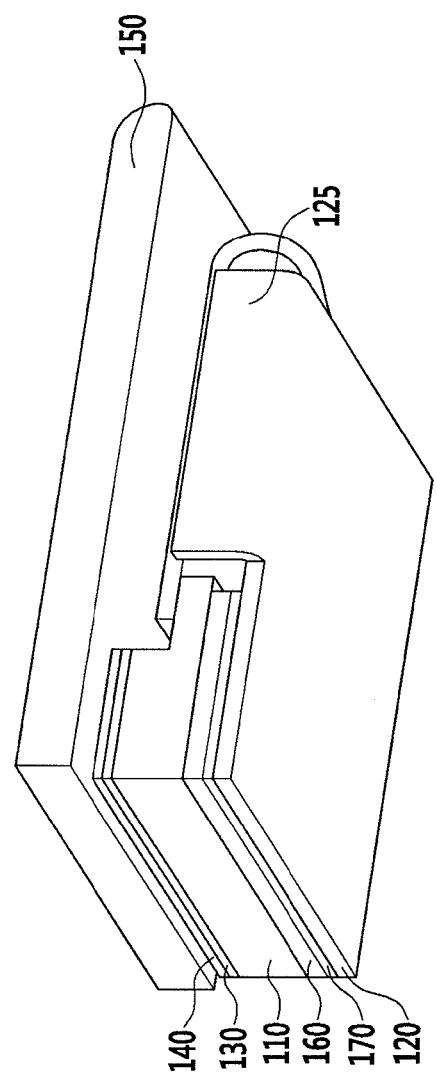
FIG. 3 is a perspective view showing a state in which an electrical element is not exposed outside by a protection portion in the display apparatus shown in FIG. 2.

Also, as shown in FIG. 3, one surface of the protection portion 125 may be positioned to be toward the electrical element 121. That is, the protection portion 125 may be formed at a position where the electrical element 121 is not exposed outside. Accordingly, although an instant high voltage such as the electrostatic discharge is generated at the outside, the electrical element 121 may be protected from the high voltage by the protection portion 125 having the excellent insulating property.

Meanwhile, the protection portion 125 may be integrally formed with the combination portion 122 or the connection portion 124. Hereafter, for better understanding and ease of description, the protection portion 125 is integrally formed with the connection portion 124. A method of integrally forming the protection portion 125 and the connection portion 124 may simplify the manufacturing process as opposed to a method in which the protection portion 125 and the connection portion 124 are respectively formed and are combined. Also, the durability of the boundary of the protection portion 125 and the connection portion 124 may be improved.

A cover layer 120e may not be formed at the protection portion 125. In general, the cover layer 120e is used to protect and insulate the exposed surface of the flexible printed circuit 120. The cover layer 120e may be made of a material having higher rigidity than a general flexible plastic used as the material of the flexible printed circuit 120. By omitting the cover layer 120e made of this material in the protection portion 125, the protection portion 125 may be easily bent in the direction adjacent to the electrical element 121.

The flexible printed circuit 120 may include a ground terminal 126. The ground terminal 126 is formed at the bottom surface corresponding to the portion on which the electrical element 121 is mounted in the connection portion 124.

Figure 4:
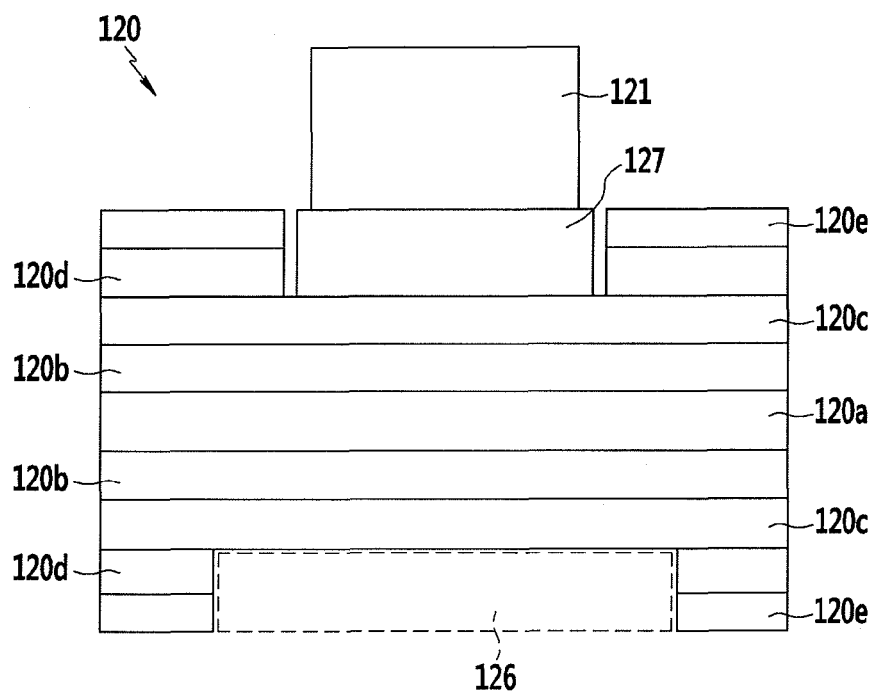
FIG. 4 is an enlarged cross-sectional view of a portion where a ground terminal is formed in a flexible printed circuit at the display apparatus shown in FIG. 1.

FIG. 4 is an enlarged cross-sectional view of a portion where a ground terminal is formed in a flexible printed circuit at the display apparatus shown in FIG. 1.

Referring to FIG. 4, as an example of a detailed structure of the flexible printed circuit 120 including the ground terminal 126, when the flexible printed circuit 120 is deposited with two layers, with reference to a base film 120a, a copper layer 120b is formed on an outer surface thereof, and a copper thin film 120c is formed on the outer surface of the copper layer 120b. An adhesive layer 120d and the cover layer 120e are sequentially formed on the outer surface of the copper thin film 120c.

Here, the described electrical element 121 may be formed on the copper thin film 120c by solder 127. Also, the ground terminal 126 may be formed to be electrically connected to the copper layer 120b under the flexible printed circuit 120. As an example of connecting the ground terminal 126 to the copper layer 120b under the flexible printed circuit 120, portions of the adhesive layer 120d and the cover layer 120e may be removed by an etching method, however it is not limited thereto. Here, the flexible printed circuit 120 is formed with two layers, however it is not limited thereto, and the flexible printed circuit 120 may be formed with three layers or more.

Figure 5:
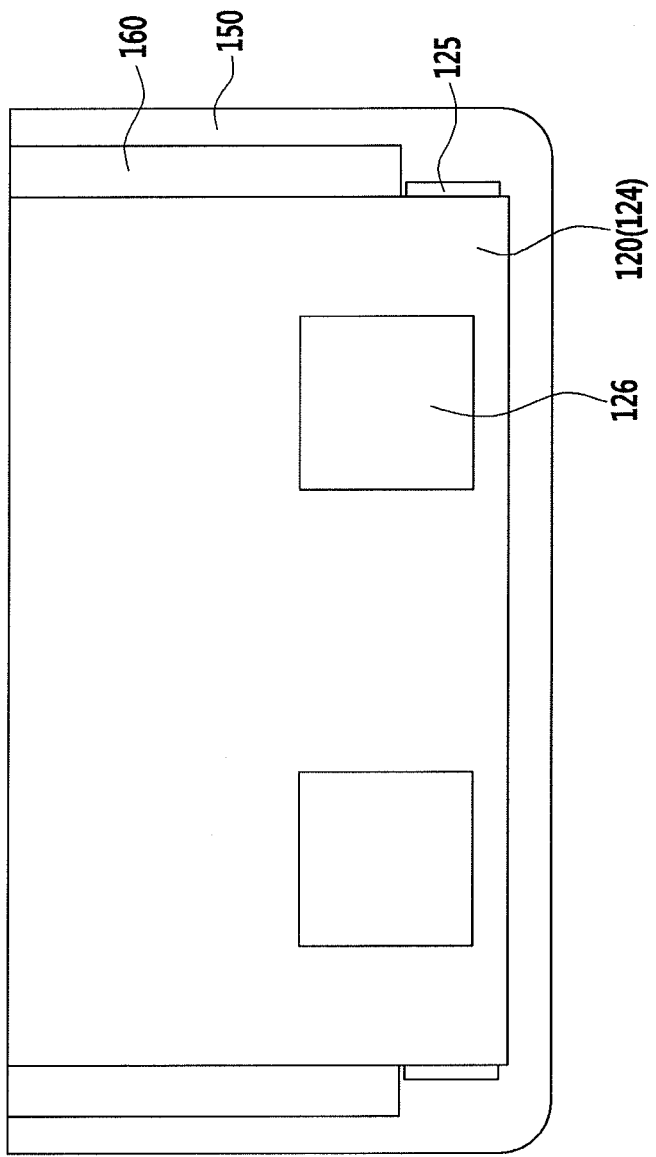
FIG. 5 is a bottom view of a lower surface of the flexible printed circuit including the ground terminal at the display apparatus shown in FIG. 1.

As shown in FIG. 5, the ground terminal 126 has a function as a path for discharging the ESD. Accordingly, the electrical element 121 may be further stably protected from the ESD.

As an example of a detailed structure of an organic light emitting diode (OLED) display, the organic light emitting diode (OLED) display may include a polarizing plate 130, a window 150, an adhesive layer 140, a double-sided adhesive tape 160, and a main board 170.

The polarizing plate 130 may be formed on the panel assembly 110. The polarizing plate 130 aligns the direction of the passing light, thereby incident light is divided into two polarization components, and only one component of them may be passed and the other component may be absorbed or dispersed.

The window 150 may be formed on the polarizing plate 130. The window 150 may be formed of glass or an acryl having excellent transmittance. The window 150 may output the image output by the organic light emitting element to the outside.

The adhesive layer 140 is formed between the polarizing plate 130 and the window 150. An example of the adhesive layer 140 may be an optical clear adhesive (OCA) film.

The main board 170 is disposed under the panel assembly 110. The main board 170 may be electrically connected to the panel assembly 110 by the described flexible printed circuit 120. The main board 170 transmits a control signal to the panel assembly 110.

The double-sided adhesive tape 160 is interposed between the panel assembly 110 and the main board 170. The double-sided adhesive tape 160 adheres the panel assembly 110 and the main board 170 to each other. Also, the double-sided adhesive tape 160 prevents an impact transmitted to the main board 170 from the outside from being transmitted to the panel assembly 110.

Here, the organic light emitting diode (OLED) display 100 is not always limited to the above described structure.

According to at least one of the disclosed embodiments, the electrical element is disposed at a space formed by the bent portion of the flexible printed circuit. Accordingly, the flexible printed circuit encloses and protects the electrical element such that the electrical element may be protected from ESD while realizing slimness even though an additional metal shield is not disposed at the electrical element. Also, by omitting the additional metal shield, the manufacturing cost may be reduced.

Further, compared with a conventional display apparatus (not necessarily prior art), the electrical element is formed at the bottom surface of the flexible printed circuit and a hole receiving the electrical element is formed at a non-illustrated frame. However, in the display apparatus according to an exemplary embodiment, the electrical element is not protruded from the bottom surface of the flexible printed circuit. Accordingly, by omitting the hole in the non-illustrated frame, the resistance of the frame against external impact is improved such that durability of the display apparatus by an external force may be improved.

The drawings referred to in the above and the disclosed detailed description are only for illustrative purpose and are not intended to restrict the meanings or limit the scope of the present invention claimed in the claims. Therefore, those skilled in the art can understand that various modifications and other equivalent exemplary embodiment may be made therefrom. Accordingly, the true technical protection scope of the present invention must be determined by the technical spirit of the accompanying claims.

What is claimed is:

1. A display apparatus comprising:
   a panel assembly configured to output an image;
   a flexible printed circuit including i) a combination portion having at least a portion coupled to the panel assembly, ii) a base portion disposed to face a lower side of the panel assembly, and iii) a connection portion having at least a portion bent to connect the combination portion and the base portion; and
   an electrical element mounted on a surface facing the combination portion in the connection portion of the flexible printed circuit,
   wherein the flexible printed circuit comprises a ground terminal formed at a bottom surface facing a portion in which the electrical element is mounted in the connection portion.

2. The display apparatus of claim 1, wherein the electrical element is disposed at a substantially flat surface in the connection portion.

3. The display apparatus of claim 1, wherein the flexible printed circuit further comprises a protection portion extending from one side surface of the combination portion or the connection portion and to be bent in a direction adjacent to the electrical element.

4. The display apparatus of claim 3, wherein one surface of the protection portion is positioned to be toward the electrical element.

5. The display apparatus of claim 4, wherein the protection portion is integrally formed with the combination portion or the connection portion.

6. The display apparatus of claim 4, wherein the protection portion is made of the same material as the combination portion or the connection portion.

7. The display apparatus of claim 1, wherein the electrical element is one of a transistor, a diode and a capacitor.

* * * * *